(12) United States Patent
Kobayashi et al.

(10) Patent No.: US 8,094,221 B2
(45) Date of Patent: Jan. 10, 2012

(54) SOLID-STATE IMAGING DEVICE

(75) Inventors: Hiroya Kobayashi, Hamamatsu (JP); Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 444 days.

(21) Appl. No.: 12/445,011

(22) PCT Filed: Oct. 9, 2007

(86) PCT No.: PCT/JP2007/069677
§ 371 (c)(1),
(2), (4) Date: Apr. 28, 2009

(87) PCT Pub. No.: WO2008/044675
PCT Pub. Date: Apr. 17, 2008

(65) Prior Publication Data
US 2010/0053388 A1  Mar. 4, 2010

(30) Foreign Application Priority Data

Oct. 11, 2006  (JP) .............................. P2006-277900

(51) Int. Cl.
*H04N 5/335* (2011.01)
(52) U.S. Cl. ........................ 348/294; 348/340
(58) Field of Classification Search ................. 348/294, 348/340
See application file for complete search history.

(56) References Cited

U.S. PATENT DOCUMENTS

| 6,384,473 | B1 | 5/2002 | Peterson et al. |
| 6,566,745 | B1 | 5/2003 | Beyne et al. |
| 2002/0088987 | A1 | 7/2002 | Sakurai |
| 2006/0044433 | A1 | 3/2006 | Akram |
| 2006/0202318 | A1 | 9/2006 | Satou et al. |
| 2009/0243024 | A1* | 10/2009 | Yoneta et al. ................. 257/459 |

FOREIGN PATENT DOCUMENTS

| DE | 100 57 647 | 1/2002 |
| EP | 1 622 367 | 2/2006 |
| JP | 2001-197375 | 7/2001 |
| JP | 2002-222936 | 8/2002 |
| JP | 2002-231913 | 8/2002 |
| JP | 2004-319791 | 11/2004 |
| JP | 2004-328386 | 11/2004 |
| WO | WO 99/30367 | 6/1999 |
| WO | WO 2006/035963 | 4/2006 |

* cited by examiner

Primary Examiner — David N Spector
(74) Attorney, Agent, or Firm — Drinker Biddle & Reath LLP

(57) ABSTRACT

A solid-state image pickup device comprising: a multilayer wiring board 2 having an opening portion 21; a spacer 3 covered with a conductive film 32, and fixed to the multilayer wiring board 2 in a state of making the conductive film 32 face contact with a reference potential electrode exposed into the opening portion 21 of the multilayer wiring board 2; a solid-state image pickup element 4 fixed to the spacer 3 in a state of face contact with the conductive film 32 of the spacer 3, and arranged in the opening portion 21; and an optical element 5 fixed at a position opposing the solid-state image pickup element 4 via the spacer 3, and transmitting light into the opening portion.

3 Claims, 4 Drawing Sheets

SOLID-STATE IMAGING DEVICE

TECHNICAL FIELD

The present invention relates to a solid-state image pickup device, and more particularly, to a solid-state image pickup device with a back-illuminated solid-state image pickup element.

BACKGROUND ART

For this type of solid-state image pickup device, an opening portion is provided at the center of a ceramic or resin package, a solid-state image pickup element is arranged in the opening portion, and an optical element such as a lens is arranged at a predetermined distance from the solid-state image pickup element (see Patent Documents 1 to 3, for example).

Patent Document 1: Japanese Published Unexamined Patent Application No. 2001-197375
Patent Document 2: Japanese Published Unexamined Patent Application No. 2002-231913
Patent Document 3: Japanese Published Unexamined Patent Application No. 2004-328386

DISCLOSURE OF THE INVENTION

Problem to be Solved by the Invention

Meanwhile, for the solid-state image pickup device, it is necessary to strictly control a separation distance between the solid-state image pickup element and optical element. In a common solid-state image pickup device, the solid-state image pickup element and the optical element are mounted in a package, and the separation distance between the solid-state image pickup element and lens depends on the molding accuracy of the package. For example, in the invention described in the above Patent Document 1, a mounting portion having a stepped plurality of plane portions is formed in the opening portion of the package, and the solid-state image pickup element and the lens are respectively mounted on the mounting portion, so that the accuracy of the separation distance between the solid-state image pickup element and lens depends on the molding accuracy of the mounting portion to be formed in the opening portion of the package.

Although there are packages made of resin and made of ceramic, since the packages made of resin are not so high in the accuracy of molding dies, there is also a limit to the molding accuracy etc., of the packages (mounting portions). Moreover, the packages made of resin have large thermal expansion coefficients, and thus, in operation of the solid-state image pickup device, expand or contract due to heat from the solid-state image pickup device to fluctuate the separation distance. On the other hand, the packages made of ceramic are likely to have variation in molding accuracy, as these contract in the course of sintering. In this case, it can also be considered to process the part on which the solid-state image pickup element and the optical element are mounted, processing is difficult because the part has a relatively complex shape.

Therefore, the present invention aims to provide a solid-state image pickup device that allows improving the dimensional accuracy of the separation distance between the solid-state image pickup element and optical element without depending on the molding accuracy etc., of the package.

Means for Solving the Problem

A solid-state image pickup device according to the present invention includes: a multilayer wiring board having an opening portion; a spacer covered with a conductive film and fixed to the multilayer wiring board in a state of making the conductive film face contact with a reference potential electrode exposed into the opening portion of the multilayer wiring board; a solid-state image pickup element fixed to the spacer in a state of face contact with the conductive film of the spacer, the solid-state image pickup element arranged in the opening portion; and an optical element fixed at a position opposing the solid-state image pickup element via the spacer, the optical element transmitting light into the opening portion.

According to the present invention, one end face of the spacer is fixed with the solid-state image pickup element and the other end face is fixed with the optical element, and thus the separation distance between the solid-state image pickup element and the optical element is to be determined by the thickness of the spacer. As for the spacer, it is possible to improve the dimensional accuracy of the thickness since machining thereof is easy. Accordingly, the accuracy of the separation distance between the solid-state image pickup element and the optical element can be improved independent of the molding accuracy of the package.

Moreover, the spacer has a high electrical conductivity and a high thermal conductivity since this is covered with the conductive film. In addition, the conductive film of the spacer and the reference potential electrode exposed into the opening portion of the multilayer wiring board are joined in a face contact state and the conductive film of the spacer and the solid-state image pickup element are joined in a face contact state, and thus there is also a high thermal conductivity and electrical conductivity at the contact parts. Accordingly, the reference potential of the solid-state image pickup element is stabilized, and heat radiation of the solid-state image pickup element is improved so that electrical characteristics of the solid-state image pickup element are stabilized.

Moreover, it is preferable that solid-state image pickup device comprises a positional alignment mark on a light-incident surface of the optical element and a surface, opposing the optical element, of the solid-state image pickup element.

According to this preferred solid-state image pickup device, since the optical element and solid-state image pickup element are provided with the positional alignment mark, an adjustment of the positional relationship between the solid-state image pickup element and the optical element is simplified at the time of assembly of the device. Accordingly, the solid-state image pickup element and optical element can be arranged on the multilayer wiring board with high accuracy.

Moreover, for the solid-state image pickup device, it is preferable that the spacer has an element body made of aluminum nitride.

According to this preferred solid-state image pickup device, since the element body to form the spacer is made of aluminum nitride with high thermal conductivity and small thermal expansion coefficient, the spacer is to have a high thermal conductivity and a small thermal expansion coefficient. Accordingly, heat radiation of the solid-state image pickup element is improved so that electrical characteristics of the solid-state image pickup element are stabilized, and a fluctuation in separation distance between the solid-state image pickup element and the optical element becomes considerably small.

Effects of the Invention

The present invention can provide a solid-state image pickup device that allows improving the accuracy of the separation distance between the solid-state image pickup element and optical element without depending on the molding accuracy of the package.

Figure 1:
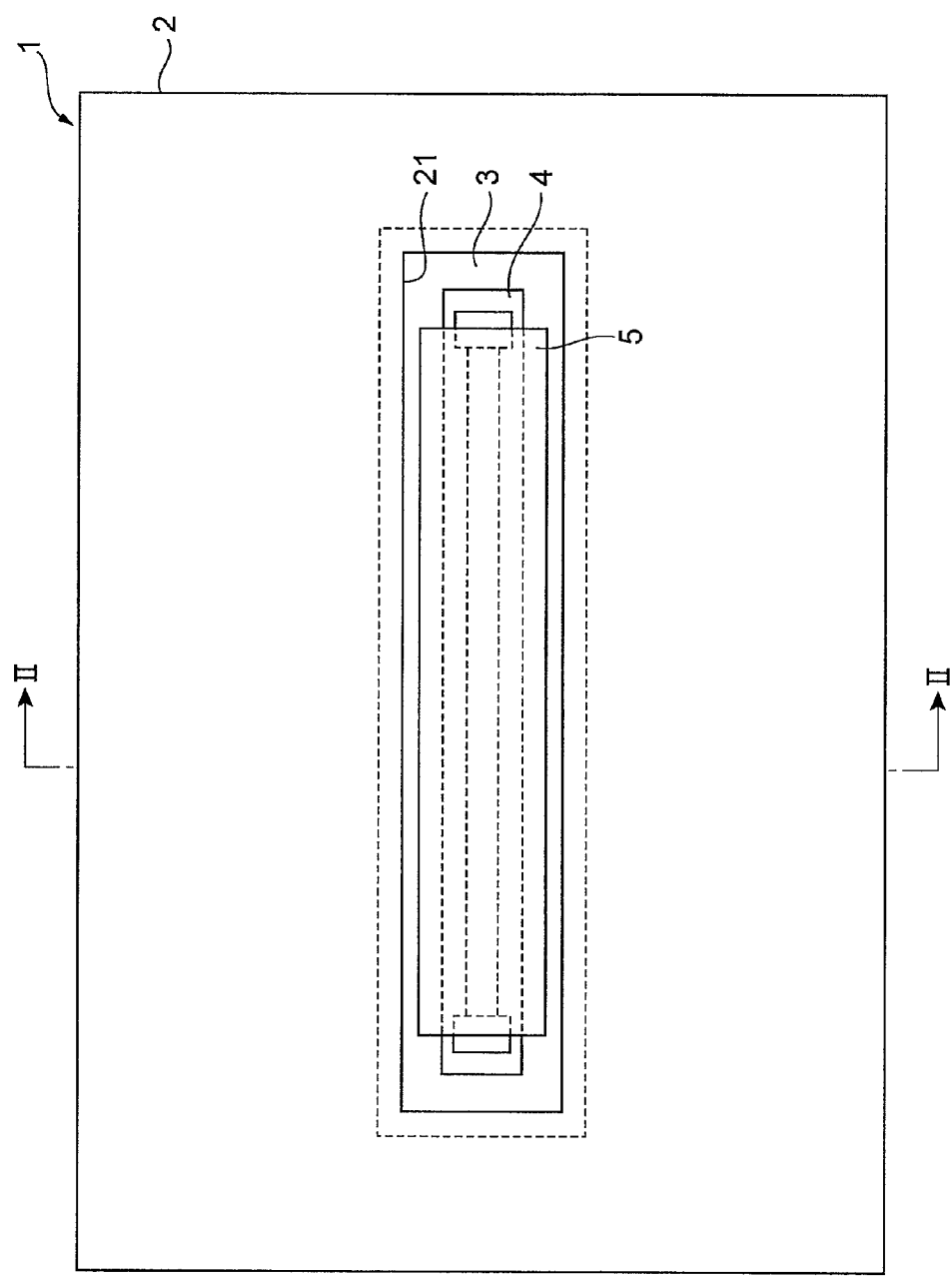
[FIG. 1] A plan view of a solid-state image pickup device according to a first embodiment.

DESCRIPTION OF REFERENCE NUMERALS AND SYMBOLS 1, 10 . . . solid-state image pickup device, 2 . . . multilayer wiring board, 3 . . . spacer, 4 . . . CCD chip (solid-state image pickup element), 5 . . . lens (optical element), 6 . . . electrode pin for external connection, 7 . . . bonding wire, 71, 82 . . . positional alignment mark.

BEST MODES FOR CARRYING OUT THE INVENTION

The findings of the present invention can be easily understood in view of the following detailed descriptions with reference to the accompanying drawings, which are given by way of illustration only. Embodiments of the present invention will now be explained with reference to the accompanying drawings. When possible, parts identical to each other will be referred to with reference numerals identical to each other, and overlapping explanations will be omitted.

First Embodiment

Figure 2:
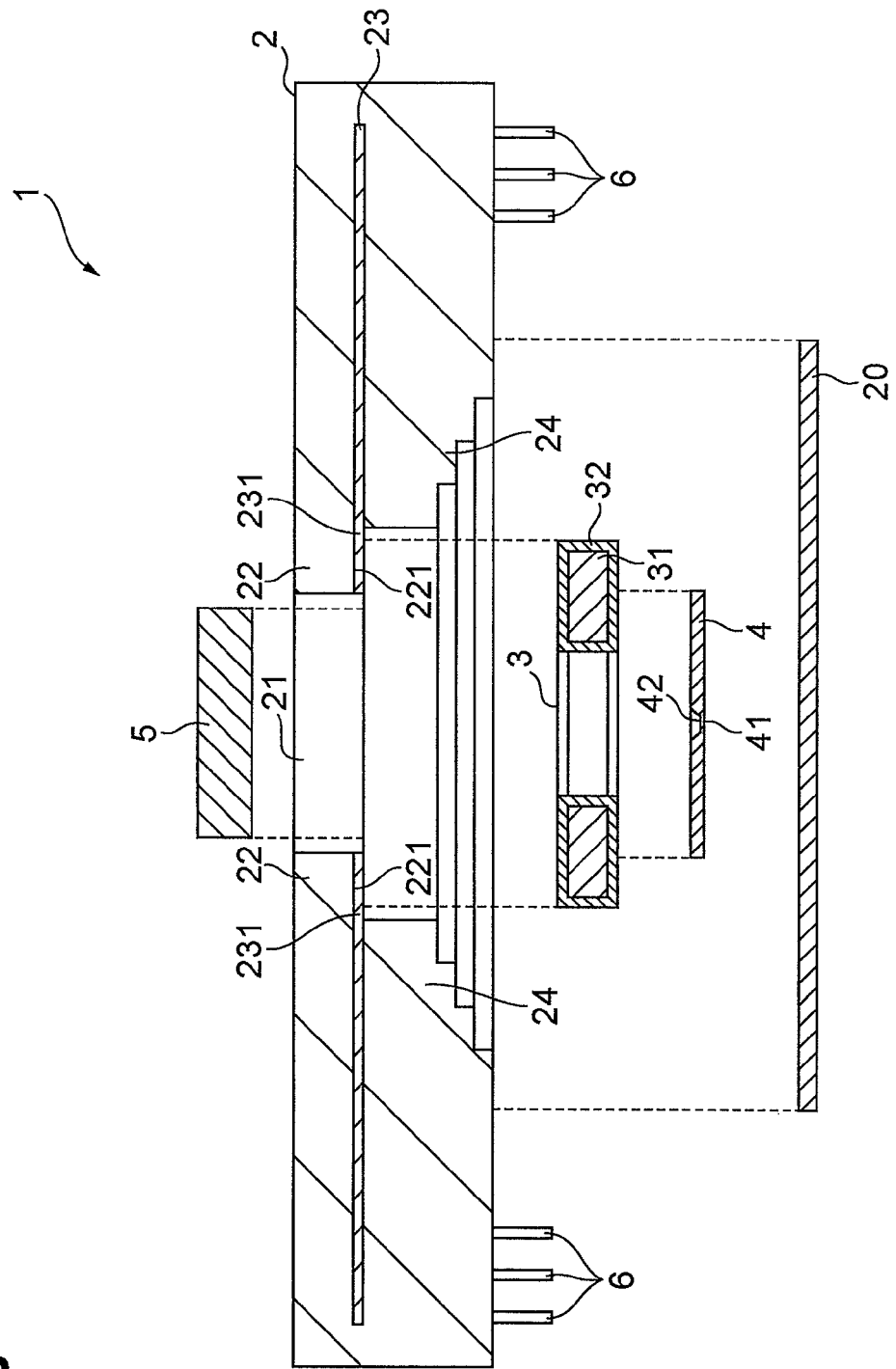
[FIG. 2] A view showing, in an exploded manner, a section along a line II-II of the solid-state image pickup device according to the first embodiment shown in FIG. 1.
Figure 3:
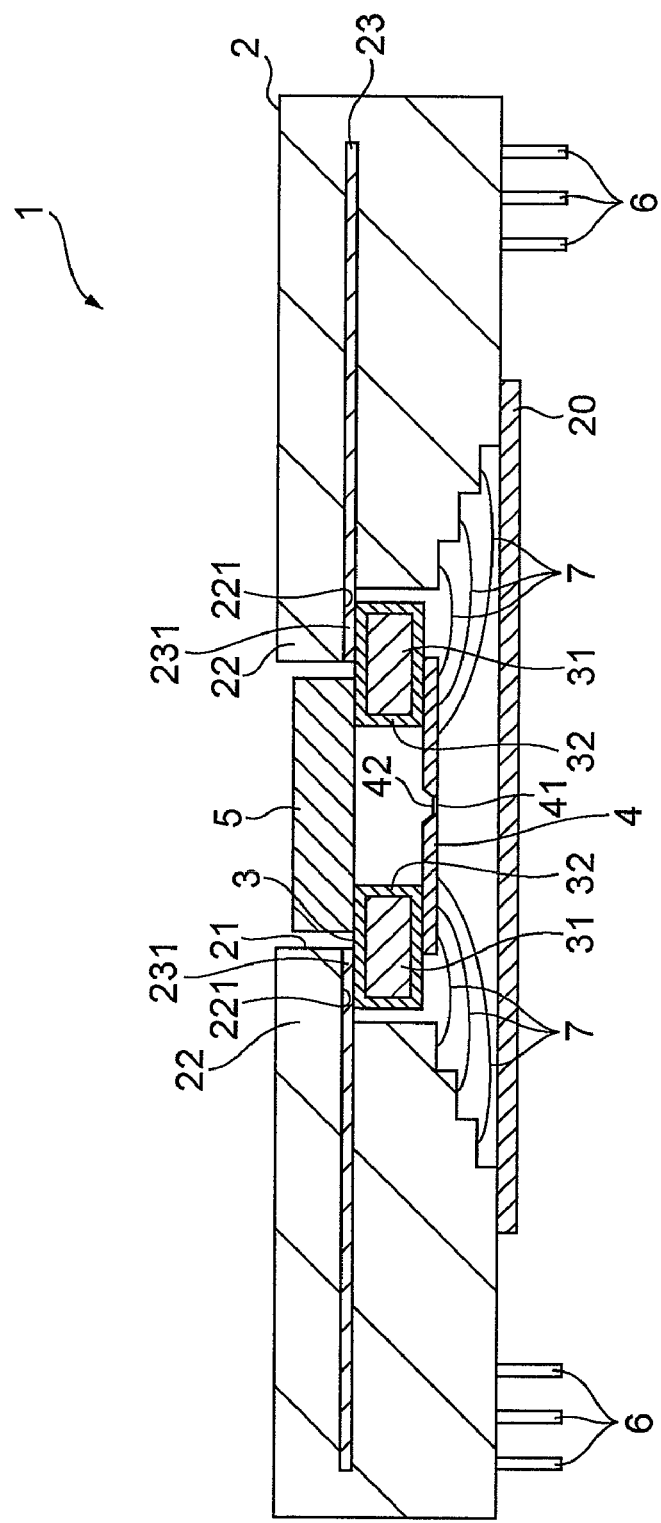
[FIG. 3] An end view along the line II-II of the solid-state image pickup device according to the first embodiment shown in FIG. 1.

Referring to FIG. 1 to FIG. 3, a solid-state image pickup device, which is a first embodiment, will be explained. FIG. 1 shows a plan view of a solid-state image pickup device according to the present embodiment. FIG. 2 is a view showing, in an exploded manner, a section along a line II-II of the solid-state image pickup device according to the present embodiment shown in FIG. 1. FIG. 3 shows an end view along the line 11-11 of the solid-state image pickup device according to the present embodiment shown in FIG. 1.

The solid-state image pickup device 1 has a rectangular plate-like multilayer wiring board 2 (package), and there formed in a central portion of the multilayer wiring board 2 is an opening portion 21 that is opened from the front surface (light-incident surface) of the board to the back surface (a surface on the side opposite to the light-incident surface) and extended in the longitudinal direction thereof. Moreover, there provided in the opening portion 21 of the multilayer wiring board 2 is a mounting portion 22 so as to protrude into the opening portion along the front surface of the board. To the mounting portion 22, a CCD chip 4 (solid-state image pickup element) is fixed via a spacer 3 so as to have a light-incident surface at the back surface side. Moreover, a lens 5 (optical element) is fixed to the spacer 3 so as to oppose the back surface side of the CCD chip 4. Further, a cover member 20 to cover the opening portion is fixed at the back surface side of the multilayer wiring board 2. The respective components will be explained in the following.

The multilayer wiring board 2 is formed by stacking upward in sequence a plurality of ceramic layers respectively having rectangular opening parts different in size so that the size of the opening parts becomes smaller as it goes upward. Then, the opening parts formed in the respective ceramic layers are overlapped to form the opening portion 21 extended stepwise from the front surface side toward the back surface side of the board, and the mounting portion 22 is provided at the front surface side of the board, and a step portion 24 is provided at a further back surface side than the mounting portion 22. Moreover, a predetermined shape of internal wiring is formed between the ceramic layers.

The mounting portion 22 provided in the opening portion 21 has a mounting face 221 facing the back surface side of the board, and on the mounting face 221, an electrode pad 231 (reference potential electrode) is formed. The electrode pad 231 is electrically connected with a ground wiring 23 that is formed inside the multilayer wiring board 2 and to be a ground potential (0V) as a reference potential. Although, in the present embodiment, the reference potential is provided as the ground potential, the reference potential is not limited thereto, and may be provided as a potential applied with a predetermined voltage so as to be, for example, plus or minus 5V, 8V, or the like.

Moreover, the step portion 24 is formed of three steps, and on a plane portion of each step, formed is a bonding pad (not shown) for externally taking out the electrode (clock electrode, output electrode, shield electrode) of the CCD chip 4. The bonding pad is externally led out via internal wiring (not shown) of the multilayer wiring board 2, and the part from which the internal wiring is externally led out is fixedly attached with an electrode pin 6 for an external connection by brazing etc. The electrode of the CCD chip 4 and the bonding pad are connected via a bonding wire 7.

The spacer 3 has a rectangular outline of an outer periphery larger than an inner periphery of the opening portion 21 provided at the front surface side of the multilayer wiring board 2, and is a construction that a ceramic element body 31 having a rectangular opening part of an inner periphery smaller than the inner periphery of the opening portion 21 is covered with a conductive film 32. Moreover, of the spacer 3, an outer peripheral edge portion of one end face is fixed across the entire periphery along the mounting face 221 of the multilayer wiring board 2. In that case, the electrode pad 231 formed on the mounting face 221 and the conductive film 32 (a part formed on one end face) of the spacer 3 are fixed in a face contact state by use of a conductive adhesive. Also, an inner peripheral edge portion of one end face of the spacer 3 reaches a state protruded from the mounting portion into the opening portion across the entire periphery to thereby form a face on which the lens 5 to be described later is mounted.

For the ceramic element body of the spacer 3, a material with high thermal conductivity and small thermal expansion coefficient is preferably used. In the present embodiment, aluminum nitride is used as the material of the ceramic element body. Moreover, since the thickness of the spacer 3 results in a separation distance between the CCD chip 4 and the lens 5, the ceramic element body 31 is processed with high accuracy so as to have a predetermined thickness.

For the conductive film that covers the front surface of the ceramic element body 31, a metal material of Au, Cu, Al, or the like having a high electrical conductivity is preferably used. Because Al easily forms an oxide film and declines in electrical conductivity, either of Au and Cu is particularly preferable. In the present embodiment, Au is used to form the conductive film. As a method for forming the conductive film, a thin-film forming method such as plating and sputtering that can cover the front surface of the ceramic element body 31 with a conductive film at a uniform thickness is used.

The CCD chip 4 is a back-illuminated CCD chip, which has a photosensitive portion 41 (for example, 4098 pixels of 130 μm×18 μm disposed one-dimensionally) that converts light made incident to an electric charge at the front surface side, and in a region (inner region) at the back surface side including a region corresponding to the photosensitive portion 41, a low-profile part 42 trimmed thin to a thickness of approximately 10 μm to 30 μm is formed. Also, the low-profile part 42 is a region to receive light, and the region is formed smaller than the opening part of the spacer 3.

The CCD chip 4 is fixed to the other end face of the spacer 3 fixed to the multilayer wiring board 2 (end face on the side opposite to the end face of the spacer 3 fixed to the mounting face 221) so that the CCD chip 4 has a light-incident surface at the back surface side. In that case, the conductive film of the spacer 3 and a region (outer region) at the back surface side other than the low-profile part 42 of the CCD chip 4 are fixed so as to make face contact with each other by use of a conductive adhesive. Thereby, the back surface of the CCD chip 4 is electrically connected with the ground wiring of the multilayer wiring board 2 via the conductive film of the spacer 3 and the electrode pad (reference potential electrode) of the multilayer wiring board 2.

Also, in the back-illuminated CCD chip 4, the structure having the low-profile part 42 is formed by, first, depositing a silicon nitride film on a silicon substrate, patterning this into a desired shape through a photolithography process, and using the same as a mask for etching of the silicon substrate by an etchant made of KOH with a substrate periphery covered with the silicon nitride film being left thick.

The lens 5 is for making light incident into the CCD chip 4, and there formed are microlenses with a pitch corresponding to that of the pixels formed on the photosensitive portion 41 of the CCD chip 4. Moreover, the lens 5 has a rectangular outline of an outer periphery smaller than the inner periphery of the opening portion 21 at the front surface side of the multilayer wiring board 2, and is fixed by use of an adhesive, inside the opening portion 21, to the inner peripheral edge portion (region of one end face protruded from the mounting portion into the opening portion) of one end face of the spacer 3 so as to be arranged opposed to the back surface of the CCD chip 4.

As in the above, according to the present embodiment, one end of the spacer 3 is fixed with the CCD chip 4 and the other end is fixed with the lens 5, and thus the separation distance between the CCD chip 4 and the lens 5 is to be determined by the thickness of the spacer 3. Moreover, as for the spacer 3, it is possible to improve the dimensional accuracy of the thickness since machining thereof is easy. Accordingly, the accuracy of the separation distance between the CCD chip 4 and the lens 5 can be improved independent of the molding accuracy of the multilayer wiring board 2.

Moreover, the spacer 3 has a high electrical conductivity and a high thermal conductivity since this is covered with the conductive film 32. In addition, the conductive film 32 of the spacer 3 and the electrode pad 231 (reference potential electrode) exposed into the opening portion 21 of the multilayer wiring board 2 are joined in a face contact state and the conductive film 32 of the spacer 3 and the CCD chip 4 are joined in a face contact state, and thus there is also a high thermal conductivity and electrical conductivity at the contact parts. Accordingly, the reference potential (ground potential in the present embodiment) of the CCD chip 4 is stabilized, and heat radiation of the CCD chip 4 is improved so that electrical characteristics of the CCD chip 4 are stabilized.

Moreover, since the element body to form the spacer 3 is made of aluminum nitride with high thermal conductivity and small thermal expansion coefficient, the spacer 3 is to have a high thermal conductivity and a small thermal expansion coefficient. Accordingly, heat radiation of the CCD chip 4 is improved so that electrical characteristics of the CCD chip 4 are stabilized, and a fluctuation in separation distance between the CCD chip 4 and the lens 5 becomes considerably small.

Second Embodiment

Figure 4:
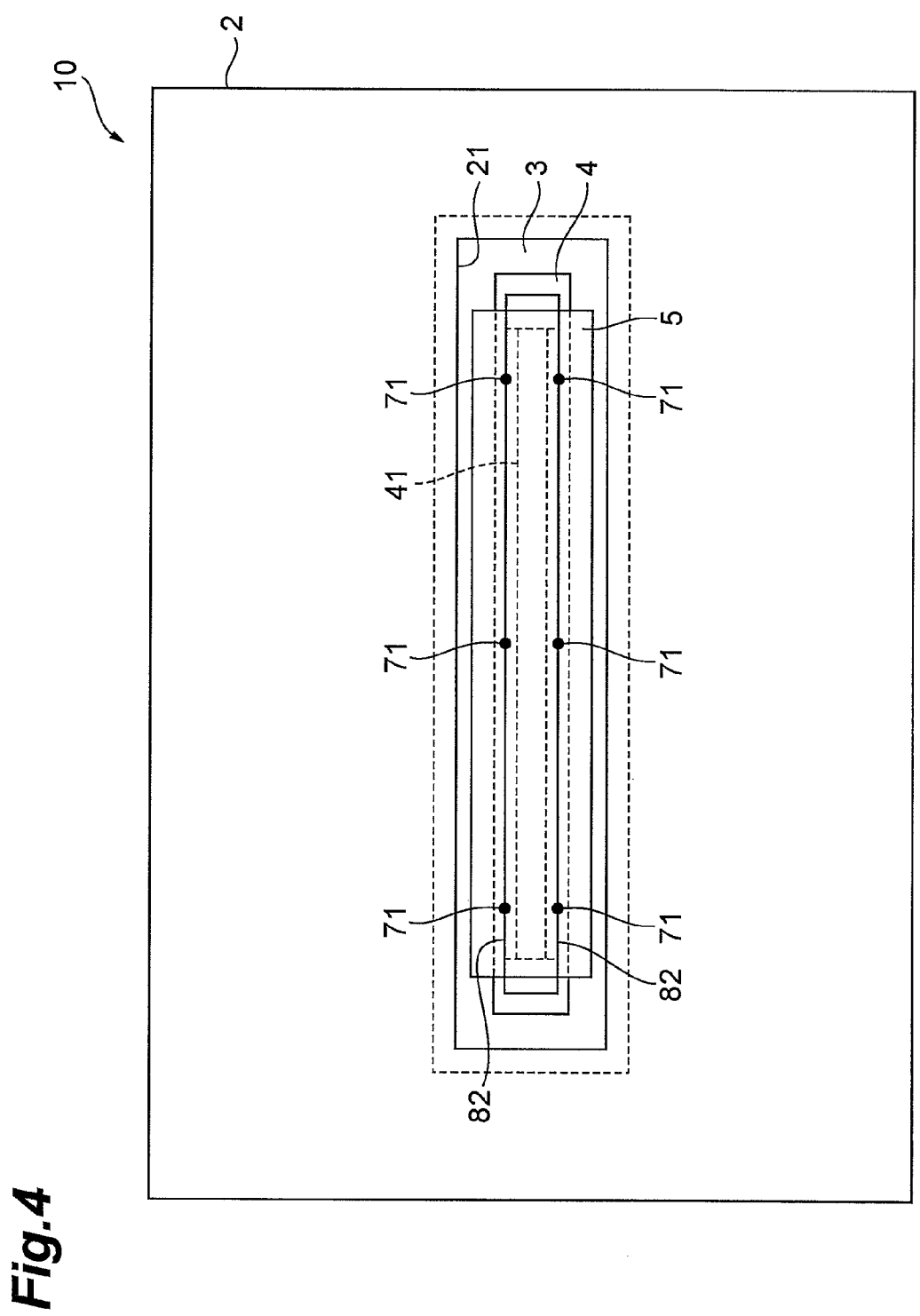
[FIG. 4] A plan view of a solid-state image pickup device according to a second embodiment.

Next, referring to FIG. 4, a second embodiment will be explained. FIG. 4 shows a plan view of a solid-state image pickup device according to the present embodiment. For a solid-state image pickup device 10 of the present embodiment, the first embodiment is further provided, in a region at the back surface side other than the low-profile part 42 of the CCD chip 4 and a non-imaging region of the light-incident surface of the lens 5, with positional alignment marks 71, 82 for positional alignment in their respective planar directions (planar directions orthogonal to the thickness direction of the multilayer wiring board). The positional alignment mark to be formed on the CCD chip 4 can be formed, when forming the low-profile part 42 on the back surface, by applying patterning through a photolithography process and etching also at the site to form the positional alignment mark.

Positioning between the CCD chip 4 and the lens 5 can be performed by observing the position of the positional alignment mark 71 of the CCD chip 4 and the position of the positional alignment mark 82 of the lens 5 and adjusting the position of the CCD chip 4 and the lens 5 so that the respective marks are coincident.

As in the above, according to the present embodiment, the CCD chip 4 and the lens 5 are provided with the positional alignment marks 71, 82, respectively, and thus an adjustment of the positional relationship between the CCD chip 4 and the lens 5 is simplified at the time of assembly of the device. Accordingly, the CCD chip 4 and the lens 5 can be arranged on the multilayer wiring board 2 at a high accuracy.

In addition, the present invention is by no means limited to the aforementioned embodiments. For example, it is preferable to arrange a bonding wire drawn out of the shield electrode of a CCD chip between a bonding wire drawn out of the clock electrode of the CCD chip and a bonding wire drawn out of the output electrode of the CCD chip. This is because crosstalk between a clock signal and an output signal can be suppressed. Moreover, for the same reason, it is preferable to further perform an arrangement from the internal wiring to the external connection terminal so that a shield is sandwiched between the clock wiring and output wiring in the same manner as wire bonding.

Moreover, the solid-state image pickup device of the present embodiment may further include a gas flow device composed of a gas supply passage and a gas discharge passage. Even when a gas resulting from decomposition of a resin material or the like such as an adhesive is released into a space made of a CCD chip, a glass, and a spacer, the gas is discharged to the outside of the multilayer wiring board through the gas flow device, and thus the gas released from the adhesive is suppressed from adhering to the light emission surface of the lens or the light-incident surface of the CCD chip and condensing, so that a decline in transmittance of incident light is suppressed. As a result, a decline in photo-detecting sensitivity of the CCD chip can be suppressed.

Moreover, a plurality of cutaway portions may be formed in an opening end portion on the light-incident surface side of the opening portion formed in the multilayer wiring board. Since a tool for lens mounting (for positional adjustment) such as tweezers can be inserted therein, workability when placing the lens on the spacer or performing a positional adjustment is improved.

The invention claimed is:

1. A solid-state image pickup device comprising:
   a multilayer wiring board having an opening portion;
   a spacer covered with a conductive film and fixed to the multilayer wiring board in a state of making the conductive film face contact with a reference potential electrode exposed into the opening portion of the multilayer wiring board;
   a solid-state image pickup element fixed to the spacer in a state of face contact with the conductive film of the spacer, the solid-state image pickup element arranged in the opening portion; and
   an optical element fixed at a position opposing the solid-state image pickup element via the spacer, the optical element transmitting light into the opening portion.

2. The solid-state image pickup device according to claim 1, comprising a positional alignment mark on a light-incident surface of the optical element and a surface, opposing the optical element, of the solid-state image pickup element.

3. The solid-state image pickup device according to claim 1, wherein the spacer has an element body made of aluminum nitride.

* * * * *